(12) United States Patent
Mawatari et al.

(10) Patent No.: US 8,997,338 B2
(45) Date of Patent: Apr. 7, 2015

(54) COMPONENT-MOUNTING DEVICE, AND COMPONENT-MOUNTING METHOD

(75) Inventors: Michiaki Mawatari, Yamanashi (JP); Hiroshi Ota, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 130 days.

(21) Appl. No.: 13/805,906

(22) PCT Filed: May 11, 2011

(86) PCT No.: PCT/JP2011/002617
§ 371 (c)(1),
(2), (4) Date: Dec. 20, 2012

(87) PCT Pub. No.: WO2012/004919
PCT Pub. Date: Jan. 12, 2012

(65) Prior Publication Data
US 2013/0086804 A1    Apr. 11, 2013

(30) Foreign Application Priority Data

Jul. 9, 2010   (JP) .................. 2010-156883

(51) Int. Cl.
*H05K 13/02*    (2006.01)
*H05K 13/04*    (2006.01)

(52) U.S. Cl.
CPC .......... *H05K 13/02* (2013.01); *Y10T 29/53039* (2013.01); *Y10T 29/49117* (2013.01); *Y10T 29/53174* (2013.01); *H05K 13/021* (2013.01); *H05K 13/0434* (2013.01)

(58) Field of Classification Search
CPC . H05K 13/02; H05K 13/021; H05K 13/0434; Y10T 29/53174; Y10T 29/53178; Y10T 29/53191
See application file for complete search history.

(56) References Cited

U.S. PATENT DOCUMENTS

| 4,873,397 A | 10/1989 | Masujima et al. |
| 6,524,052 B1 * | 2/2003 | Yamauchi et al. ......... 414/331.1 |
| 7,540,367 B2 * | 6/2009 | Terui et al. ................. 198/347.1 |
| 2005/0276170 A1 * | 12/2005 | Petrus Maria Vermeer et al. ......................... 369/30.84 |
| 2006/0228199 A1 | 10/2006 | Endo et al. |

FOREIGN PATENT DOCUMENTS

| CN | 1788532 A1 | 6/2006 |
| CN | 1993035 A1 | 7/2007 |

(Continued)

OTHER PUBLICATIONS

International Search Report for PCT/JP2011/002617 dated Jun. 14, 2011.

(Continued)

*Primary Examiner* — Livius R Cazan
(74) *Attorney, Agent, or Firm* — Pearne & Gordon LLP

(57) ABSTRACT

A tray feeder includes tray supply mechanisms and arranged in parallel. Each of the tray supply mechanisms has a function of retrieving a tray from a tray housing portion by a tray retrieving unit, and transferring the pallet up to a component pickup position set in the vicinity of a height at the upper end of the tray housing portion. A lock state of a door by a door lock mechanism is released only in a state where the tray retrieving unit is located at the component pickup position and blocks an interior of the tray feeder from a head transfer space in which the mounting head transfers.

2 Claims, 6 Drawing Sheets

(56) References Cited

FOREIGN PATENT DOCUMENTS

| JP | H3-133808 A | 6/1991 |
| JP | H5-096425 A | 4/1993 |
| JP | 2001-007594 A | 1/2001 |
| JP | 2004-335951 A | 11/2004 |

OTHER PUBLICATIONS

Chinese Office Action for Application No. 201180034063.3 dated Sep. 5, 2014.

* cited by examiner

COMPONENT-MOUNTING DEVICE, AND COMPONENT-MOUNTING METHOD

TECHNICAL FIELD

The present invention relates to a component mounting device and a component mounting method for mounting an electronic component on a substrate.

BACKGROUND ART

The component mounting device for mounting the electronic component on the substrate is equipped with a component supply unit for supplying the electronic component, and a component supply device such as a tape feeder or a tray feeder is arranged according to a type of components to be mounted in the component supply unit. In the component supply device, if stored components are consumed and out of stock, or if the type of stored components is changed for switching one type of products to another type, work for resupply of the components or for exchange of the component is conducted by an operator. In the tape feeder, a tape reel on which a carrier tape that holds components is winded and stored is exchanged for another tape reel, and in the tray feeder, a tray on which the components are stored in a plane is exchanged for another tray.

In recent years, there has been used the component supply device in which the above-mentioned component resupply or component exchange is conducted while continuing the device operation without stopping production upon a request for improving productivity in a component mounting line. For example, the tape feeder employs a tape spline system that joins the carrier tape of the mounted tape reel and a carrier tape of a tape reel to be newly exchanged. Also, the tray feeder employs the component supply device that can exchange a magazine that houses a tray therein to another magazine during the device operation (for example, refer to Patent Document 1). In the related art disclosed in the Patent Document, the magazine is detachably mounted on each of two pallet units that transfer vertically in advance, and the pallet unit on which the magazine to be exchanged is mounted is transferred to an operation position set at an ascent end or a descent end to exchange the magazine to another one.

RELATED ART DOCUMENTS

Patent Documents

Patent Document 1: JP-A-5-96425

SUMMARY OF THE INVENTION

Problem to be Solved by the Invention

In recent years, in production sites of manufacturing industries including electronic manufacturers, production facilities giving more consideration than that in the conventional art to the safety when the operator operates are demanded. For example, there are required facilities, in which assuming an event in which an unskilled operator operates a device, the safety of the operator is secured even if an unskilled operator operating a device accidentally allows his hand to enter a portion where an access by the operator is not expected. However, in the component mounting including the component supply by the tray feeder, the above safety measure is not always perfect, and the safety in conducting a process change such as the tray exchange during the device operation has been required.

An object of the present invention is to provide a component mounting device and a component mounting method that can ensure safety at a process change during device operation in a component mounting including component supply by a tray feeder.

Means for Solving the Problem

The present invention provides a component mounting device for mounting electronic components picked up from a component supply unit on a substrate, including: a tray feeder having a function of: retrieving a tray by a tray retrieving unit from a tray housing portion which are arranged in the component supply unit and which stores the tray in which the electronic components are arranged in a plane, and transferring the tray up to a component pickup position set in the vicinity of a height of the upper end of the tray housing portion; a component mounting mechanism including: a mounting head that picks up and holds the electronic components from the tray transferred to the component pickup position; and a heat transfer mechanism that transfers the mounting head; a door lock mechanism that locks open/close of an operation access door disposed in the tray housing portion in the tray feeder; and a controller that controls the component supply unit, the component mounting mechanism, and the door lock mechanism, wherein the controller releases a lock state of the door by the door lock mechanism only in a state where the tray retrieving unit is located at the component pickup position and blocks an interior of the tray feeder from a head transfer space where the mounting head transfers.

The present invention provides a component mounting method for mounting electronic components picked up from a component supply unit on a substrate by a component mounting device, the component mounting device including: a tray feeder including a plurality of tray supply mechanisms arranged in parallel, each of the tray supply mechanisms having a function of: retrieving a tray by a tray retrieving unit from a tray housing portion which are arranged in the component supply unit and which stores the tray in which the electronic components are arranged in a plane; and transferring the tray up to a component pickup position set in the vicinity of a height of the upper end of the tray housing portion; a component mounting mechanism including: a mounting head that picks up and holds the electronic components from the tray transferred to the component pickup position; and a heat transfer mechanism that transfers the mounting head; a door lock mechanism that locks open/close of an operation access door disposed in the tray housing portion in each of the plurality of tray supply mechanisms; and a controller that controls the component supply unit, the component mounting mechanism, and the door lock mechanism, and has a function of: releasing a lock state of the door by the door lock mechanism only in a state where the tray retrieving unit is located at the component pickup position and blocks an interior of the tray feeder from a head transfer space where the mounting head transfer, the component mounting method including: simultaneously executing tray exchange operation conducted on the tray housing portion in a state where the lock state of the door is released and the door is opened in any one of the tray supply mechanisms, and tray supply operation in which the tray is retrieved from the tray housing portion by the tray retrieving unit and transferred up to the component pickup position for pickup of the component by the mounting head in another tray supply mechanism.

Advantages of the Invention

In a tray feeder including tray supply mechanisms and arranged in parallel, each having a function of retrieving a tray from a tray housing portion by a tray retrieving unit, and transferring the pallet up to a component pickup position set in the vicinity of a height at the upper end of the tray housing portion, a lock state of a door by a door lock mechanism is released only in a state where the tray retrieving unit is located at the component pickup position and blocks an interior of the tray feeder from a head transfer space in which the mounting head transfers. Consequently, safety can be ensured at a process change during device operation in a component mounting including component supply by a tray feeder.

MODE FOR CARRYING OUT THE INVENTION

Figure 1:
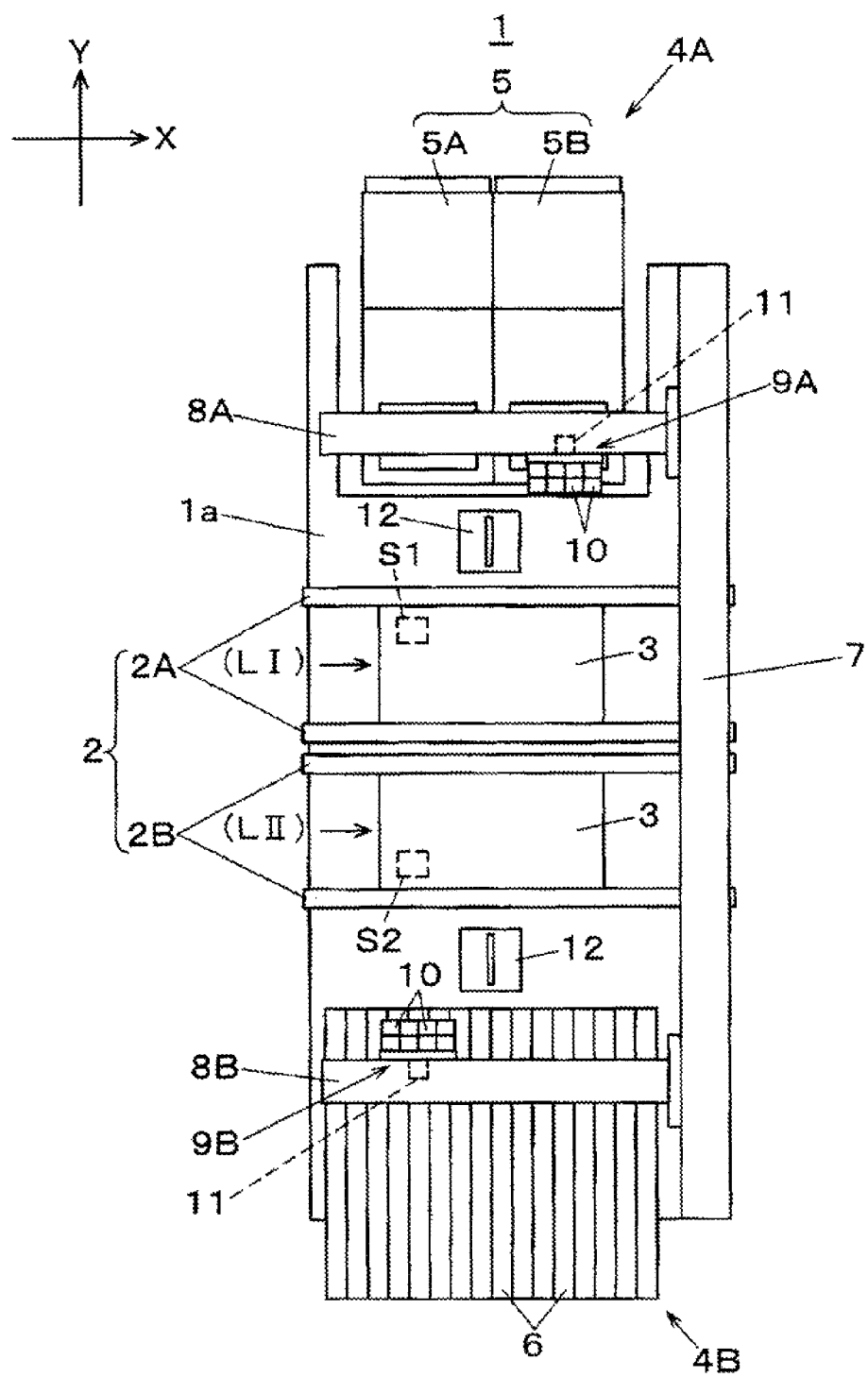
FIG. 1 is a plan view of a component mounting device according to an embodiment of the present invention.

Subsequently, an embodiment of the present invention will be described with reference to the drawings. First, a description will be given of a structure of a component mounting device 1 that mounts on a substrate an electronic component picked up from a component supply unit with reference to FIGS. 1 and 2. Referring to FIG. 1, a substrate transport mechanism 2 is disposed on a base 1a of the component mounting device 1. The substrate transport mechanism 2 is configured such that a first substrate transport lane LI and a second substrate transport lane LII for transporting respective substrates for mounting are arranged in parallel to a substrate transport direction (X-direction). The first substrate transport lane LI and the second substrate transport lane LII are configured by a pair of first substrate transport conveyers 2A and a pair of second substrate transport conveyers 2B, respectively. Each of the first substrate transport lane LI and the second substrate transport lane LII transports a substrate 3 transferred from an upstream side, and positions and holds the substrate 3 at an operation position where operation is conducted by a component mounting mechanism which will be described later. The first substrate transport lane LI and the second substrate transport lane LII are equipped with substrate detection sensors S1 and S2, respectively, and each of the substrate detection sensors S1 and 82 detects the carried substrate 3.

Figure 2:
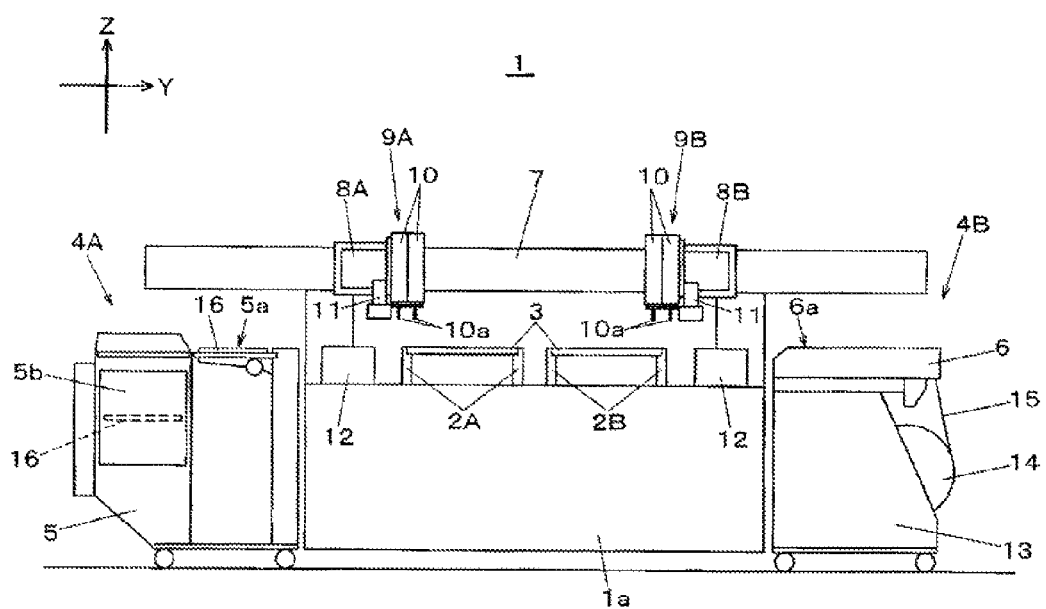
FIG. 2 is a side cross-sectional view of the component mounting device according to the embodiment of the present invention.

A first component supply unit 4A and a second component supply unit 4B are arranged on both sides of the substrate transport mechanism 2. A tray feeder 5 in which a first tray supply mechanism 5A and a second tray supply mechanism 5B are disposed in parallel is arranged in the first component supply unit 4A. As illustrated in FIG. 2, the first tray supply mechanism 5A and the second tray supply mechanism 5B configuring the tray feeder 5 have a function of retrieving, from each tray housing portion 5b, a pallet 16 that holds a tray storing relatively large-sized electronic components among electronic components to be mounted, in a plane, and of moving the pallet 16 up to each component pickup position 5a set in the vicinity of a height of the upper end of the tray housing portion 5b.

A plurality of tape feeders 6 is disposed in parallel in the second component supply unit 4B. Each of the tape feeders 6 has a function of feeding pitch by pitch a carrier tape 15 that holds small-sized electronic components up to a pickup position 6a (refer to FIG. 2). Each of the tape feeders 6 is mounted on a carriage 13 movably set in the second component supply unit 4B, and the carrier tape 15 is extracted from a supply reel 14 held by the carriage 13 and supplied to the tape feeder 6.

A Y-axial transfer table 7 is disposed on one end of an upper surface of the base 1a in a Y-direction, and a first X-axial transfer table 8A and a second X-axial transfer table 8B are mounted on the Y-axial transfer table 7 so as to be slidable in a Y-direction. A first mounting head 9A and a second mounting head 9B are mounted on the first X-axial transfer table 8A and the second X-axial transfer table 8B, respectively, so as to be slidable in the X-direction. Each of the first mounting head 9A and the second mounting head 9B is a multi-type head having a plurality of unit mounting heads 10. An adsorption nozzle 10a (refer to FIG. 2) that adsorbs and holds the electronic component is mounted on a lower end of each unit mounting heads 10.

With the driving of the Y-axial transfer table 7, the first X-axial transfer table 8A, and the second X-axial transfer table 8B, the first mounting head 9A and the second mounting head 9B transfer horizontally, individually, the first mounting head 9A picks up and holds the electronic component from the tray feeder 5 of the first component supply unit 4A, and the second mounting head 9B picks up and holds the electronic component from the tape feeders 6 of the second component supply unit 4B, so as to transfer and mount the electronic components on the substrates 3 carried in the first substrate transport lane LI and the second substrate transport lane LII. The Y-axial transfer table 7, the first X-axial transfer table BA, and the second X-axial transfer table 8B configure a head transfer mechanism that transfers the first mounting head 9A and the second mounting head 9B. The head transfer mechanism, the first mounting head 9A, and the second mounting head 9B configure a component mounting mechanism that picks up the electronic components from the pallet 16 transferred to the component pickup position 5a of the tray feeder 5 in the first component supply unit 4A, picks up the electronic components from the tape feeders 6 in the second component supply unit 4B, and mounts the electronic components on the substrates 3.

A substrate recognition camera 11 transferred integrally with each of the first mounting head 9A and the second mounting head 9B is equipped in each of the first mounting head 9A and the second mounting head 9B so as to be located on a lower surface side of each of the first X-axial transfer table 8A and the second X-axial transfer table 8B. The first mounting head 9A and the second mounting head 9B are transferred above the respective substrates 3 so that the substrates 3 can be imaged by the respective substrate recognition cameras 11. The imaged results are subjected to recognition processing to recognize the positions of the substrates 3 and the component mounted points.

A component recognition camera 12 is disposed in a path along which each of the first mounting head 9A and the second mounting head 9B is transferred to the substrates 3 from a corresponding component supply unit thereof. Each of the first mounting head 9A and the second mounting head 9B holding the electronic components is transferred above the component recognition camera 12 whereby the held electronic component is imaged by the component recognition camera 12 to recognize the position of the electronic component that is held by each of the first mounting head 9A and the second mounting head 9B. In the operation of mounting the electronic components on the respective substrates 3, the mounting positions of the first mounting head 9A and the second mounting head 9B are corrected by taking the substrate recognition results from the substrate recognition camera 11 and the component recognition results from the component recognition camera 12 into account.

Figure 3A:
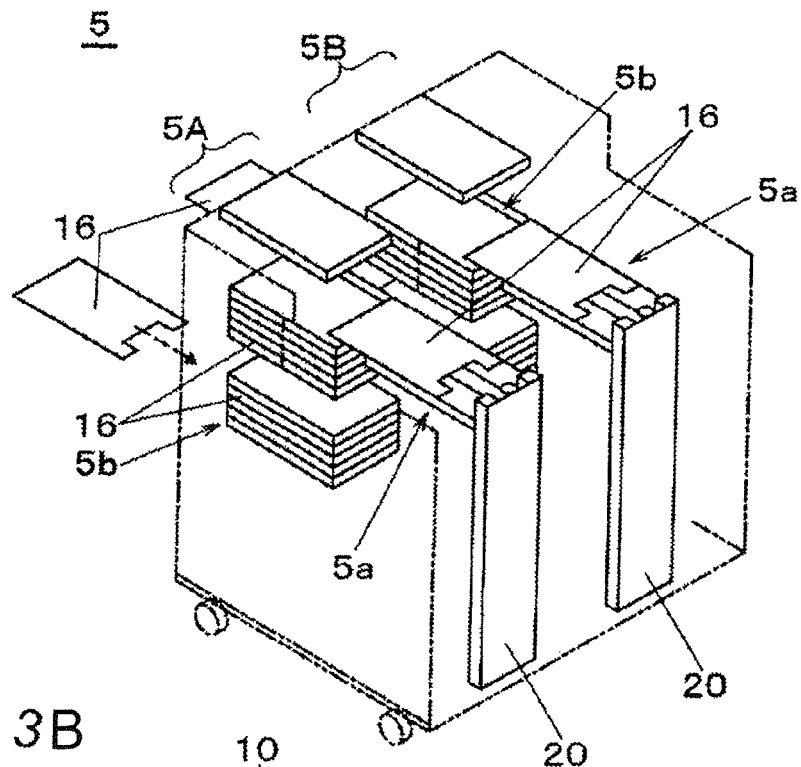
FIGS. 3A and 3B are illustrative views of a configuration of a tray feeder used in the component mounting device according to the embodiment of the present invention.

Subsequently, a structure of the tray feeder 5 will be described with reference to FIGS. 3A and 3B. As illustrated in FIG. 3A, the tray feeder 5 is configured such that the first tray supply mechanism 5A and the second tray supply mechanism 5B, which are operable, independently, are arranged in parallel to each other. Each of the first tray supply mechanism 5A and the second tray supply mechanism 5B has a function of positioning each pallet 16 holding the tray in which the electronic component is stored to the component pickup position 5a.

Figure 3B:
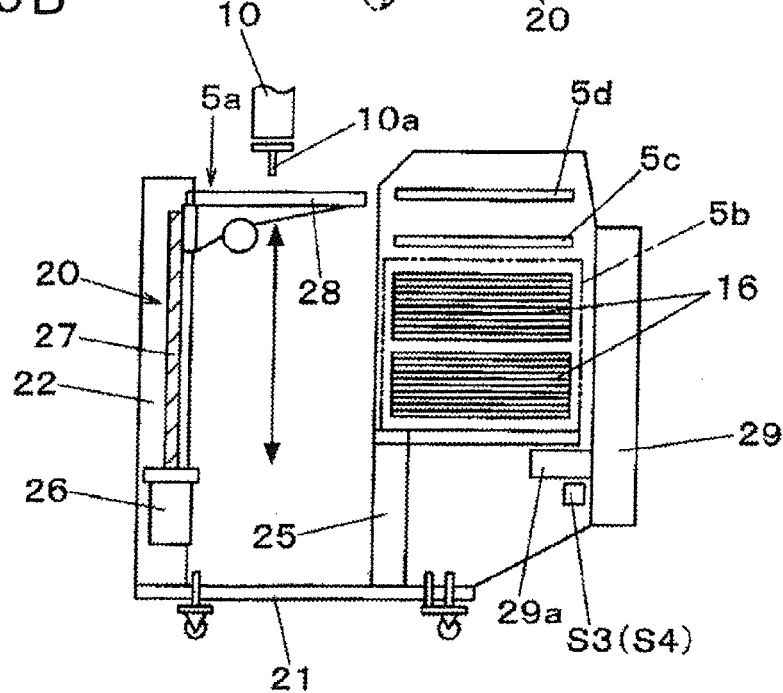

FIG. 3B illustrates a configuration of the first tray supply mechanism 5A and the second tray supply mechanism 5B. The tray housing portions 5b are fixed to a frame 25, and a plurality of the pallets 16 stacked within the magazine is stacked within each tray housing portion 5b. The tray in which a large number of electronic components are stored in a reticular pattern is loaded into each of the pallets 16 housed within the tray housing portions 5b. In the figure, the tray is not illustrated. Openable doors 29 for an operation access are disposed in the rear of the tray housing portions 5b, and the pallets 16 housed in the magazines are housed and retrieved for each of the magazines. In this example, the operation of opening and closing the doors 29 is controllably locked by a door lock mechanism 29a disposed in the tray housing portion 5b. Each door 29 can be opened only in a state where a lock state of the door lock mechanism 29a is released.

Also, in the doors 29, door open/close detection sensors S3 and S4 are disposed for the first tray supply mechanism 5A and the second tray supply mechanism 5B, respectively, and the door open/close detection sensors S3 and S4 detect the open/close state of the doors 29. The open/close state of the doors 29 is interlocked with an operation state of a movable mechanism unit of the component mounting device 1. For safety protection for the operator, in a state where the door 29 is opened, the device operation is not permitted so far as a predetermined access allowance condition is not met.

Elevating mechanisms 20 each having a motor 26 and a feed screw 27 are disposed on a frame 22, and each of the elevating mechanisms 20 is driven to move up and down the tray retrieving unit 28. Each tray retrieving unit 28 retrieves the pallet 16 housed in the tray housing portion 5b, and holds the pallet 16 on an upper surface thereof. The tray retrieving unit 28 is equipped with a pallet transfer mechanism (not shown), and the pallet 16 within the tray housing portion 5b can be retrieved to the tray retrieving unit 28, or the pallet 16 can be pushed and fed into the tray housing portion 5b so as to be housed therein, by the pallet transfer mechanism. Each of the elevating mechanisms 20 is driven to move up the tray retrieving unit 28, as a result of which the pallet 16 transfers to the component pickup position 5a of the electronic component which is picked up by each of the first mounting head 9A and the second mounting head 9B$m$, together with the held tray.

Each of the first mounting head 9A and the second mounting head 9B picks up the electronic component from the tray held in the pallet 16 by the adsorption nozzle 10a of each unit mounting head 10, and transfers and mounts the picked up electronic component onto the substrate transport mechanism 2. Each ejection unit Sc that stores the electronic components ejected without being mounted is disposed above each of the tray housing portions 5b, and each resupply unit 5d for retrieving the pallet 16 on which an empty tray is mounted after the electronic component has been picked up, or resupplying the pallet 16 after the electronic component has been resupplied is disposed above each ejection unit 5c.

Figure 4:
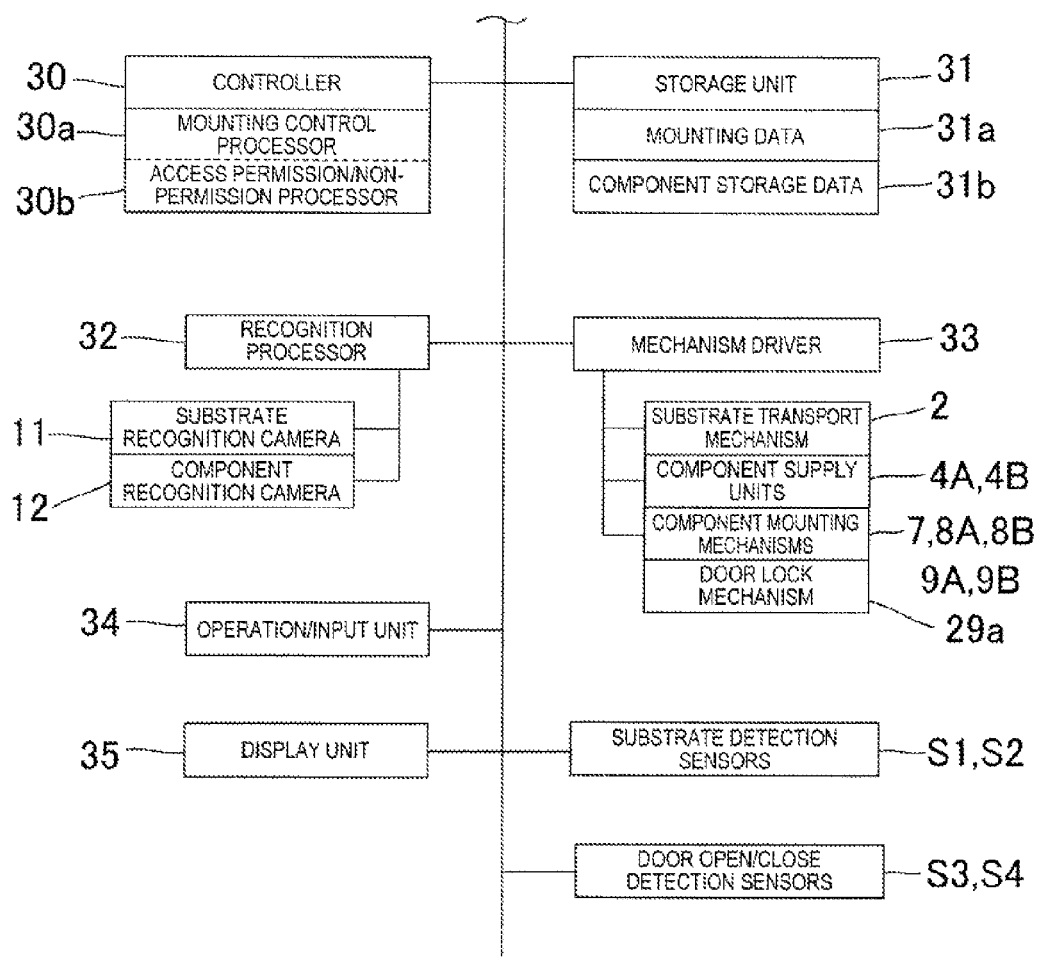
FIG. 4 is a block diagram illustrating a configuration of a control system of the component mounting device according to the embodiment of the present invention.

Subsequently, a configuration of the control system will be described with reference to FIG. 4. The component mounting device 1 includes a controller 30, a storage unit 31, a recognition processor 32, a mechanism driver 33, an operation/input unit 34, and a display unit 35. The controller 30 has a function of executing an operation control or arithmetic processing necessary for the operation of the component mounting device 1 on the basis of a control program or various data stored in the storage unit 31, and includes a mounting control processor 30a and an access permission/non-permission processor 30b for internal process function. The mounting control processor 30a processes to control mounting operation for mounting the electronic components on the substrate 3.

The access permission/non-permission processor 30b sets an access permission or non-permission of the mounting heads and the operator to the tray supply mechanism. That is, in the first tray supply mechanism 5A and the second tray supply mechanism 5B, if the door open/close detection sensors S3 and S4 detect an open state of the door 29, an access of the mounting head to the tray supply mechanism is prohibited. Also, in order that the operator accesses to the tray supply mechanism, there is a need to open the door 29. However, in this embodiment, in order to ensure the safety of the operator, interlock under control is set so that the door lock mechanism 29a releases the lock state of the door 29 only when a given state is satisfied.

The storage unit 31 stores various operation programs necessary for executing the component mounting operation as well as mounting data 31a and component storage data 31b therein. The mounting data 31a associates mounting coordinates that specify the type and the mounting position of the component to be mounted with mounting points indicative of a mounting region on the substrate 3 for mounting according to a mounting order. The component storage data 31b indicates a storage state of the tray in the tray housing portion 5b of each of the first tray supply mechanism 5A and the second tray supply mechanism 5B, and this data specifies the type and the storage position of the component in the tray housed in each of the tray housing portions 5b.

The recognition processor 32 recognizes the imaged results of the substrate recognition camera 11 and the component recognition camera 12 to detect the component mounting position on the substrate 3, discriminate the electronic component which is held in the first mounting head 9A and the second mounting head 9B, and detect the position of the electronic component. In the control of the component mounting operation by the mounting control processor 30a, the position of the component when the component is mounted is corrected taking those position detection results into account. The mechanism driver 33 is controlled by the mounting control processor 30a, and drives the substrate transport mechanism 2, the first component supply unit 4A, the second component supply unit 4B, the component mounting mechanism including the Y-axial transfer table 7, the first X-axial transfer table 8A, the second X-axial transfer table 8B, the first mounting head 9A, and the second mounting head 9B, and the door lock mechanism 29a. In the control of the mechanism driver 33 by the controller 30, the lock state of the door 29 by the door lock mechanism 29a is released only in a state where the tray retrieving unit 28 is at the component pickup position 5a close to the upper end, and the tray retrieving unit 28 blocks the interior of the tray feeder 5 from a head transfer space in which the first mounting head 9A and the second mounting head 9B transfer, by the control process of the access permission/non-permission processor 30b.

The operation/input unit 34 is an input device such as a touch panel switch or a keyboard, and designed to input operation commands or various data by the operator. The operation command includes an input command for setting a use stop of the first tray supply mechanism 5A and the second tray supply mechanism 5B. The display unit 35 is a display panel such as liquid crystal, and displays a guide screen or various annunciation screens during input operation through the operation/input unit 34.

The component mounting device 1 is configured as described above. Hereinafter, a description will be given of a component mounting method in which the electronic components are picked up from the first component supply unit 4A and the second component supply unit 4B by the first mounting head 9A and the second mounting head 9B, and mounted on the substrates 3 transported by the substrate transport mechanism 2, by the aid of the component mounting device 1 with reference to FIGS. 5, 6A, and 6B.

In starting the component mounting operation, first in the first component supply unit 4A, the trays in which the electronic components of the type corresponding to the mounting operation of the substrate 3 for mounting are stored are arranged in the first tray supply mechanism 5A and the second tray supply mechanism 5B. Then, the component mounting operation starts, and the electronic components are picked up from the trays on the pallets 16 retrieved from the first tray supply mechanism 5A and the second tray supply mechanism 5B by the first mounting head 9A, and then transferred and mounted onto the substrates 3.

In a process of continuously executing the component mounting operation, there is a need to access to the tray supply mechanism by the operator, for the component resupply when the component is out of stock in any tray supply mechanism, or preceding process change for producing a subsequent substrate type. In such cases, in order to ensure the safety of the operator, up to now, an access of the first mounting head 9A to the tray feeder 5 is prohibited, and operation such as tray exchange is executed in a state where the operation stops. For that reason, when the tray feeder 5 has the plurality of first tray supply mechanism 5A and second tray supply mechanism 5B, both of those tray supply mechanisms must stop the operation.

Figure 5:
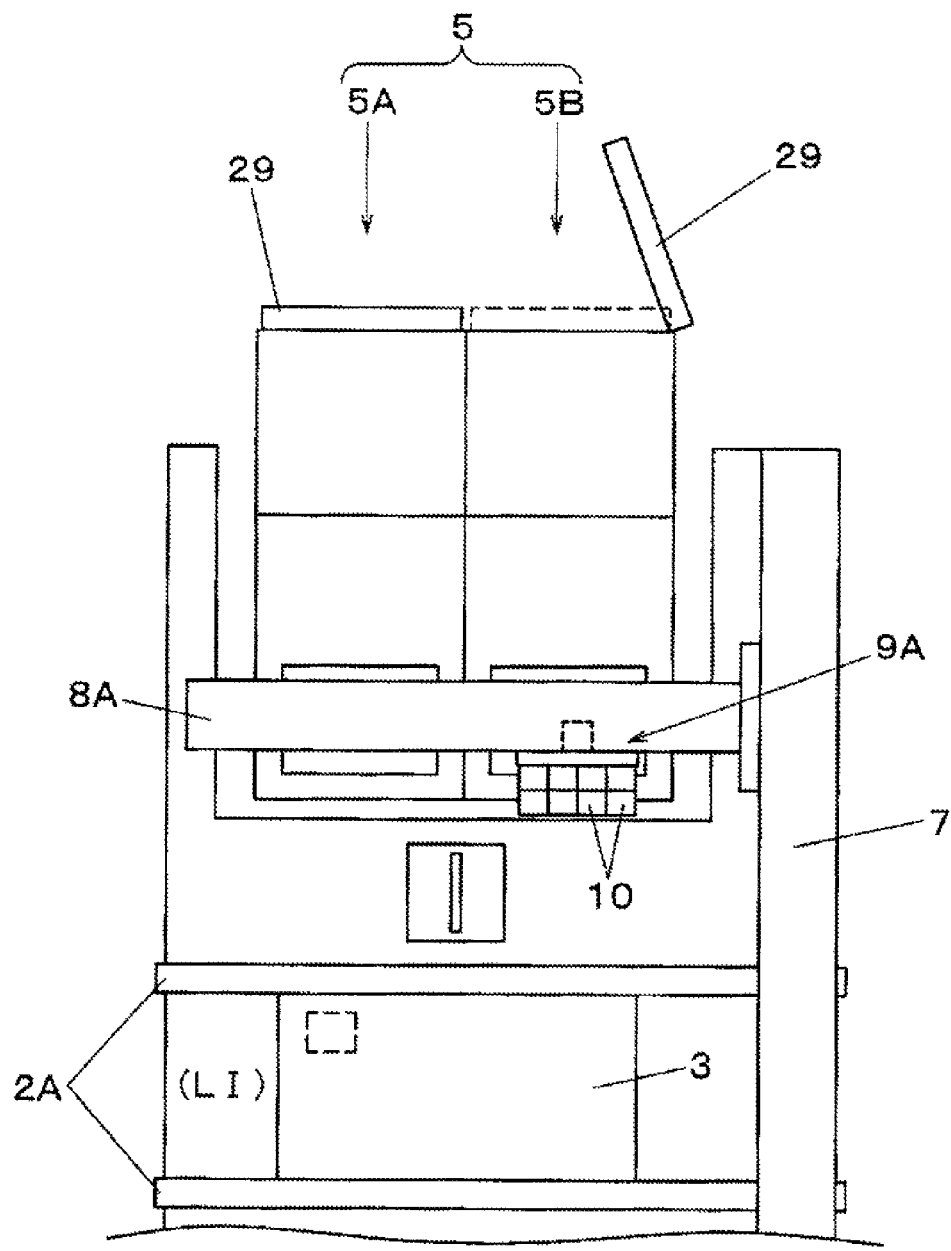
FIG. 5 is a partial plan view of the component mounting device according to the embodiment of the present invention.

On the contrary, in the component mounting device 1 according to this embodiment, only the tray supply mechanism to be accessed stops the operation, and the other tray supply mechanism is subjected to the component pickup by the first mounting head 9A as it is. That is, for example, if the tray exchange operation is required by the second tray supply mechanism 5B, as illustrated in FIG. 5, the component pickup by the first mounting head 9A is continued while the door 29 is closed in the first tray supply mechanism 5A, and the door 29 is opened in the second tray supply mechanism 5B.

Figure 6A:
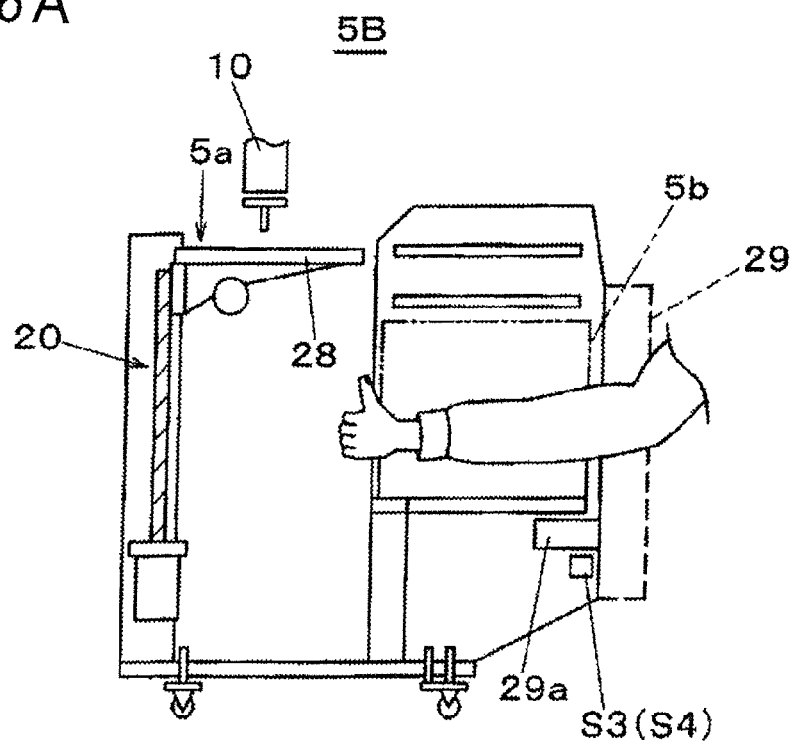
FIGS. 6A and 6B are side cross-sectional views of a tray feeder in the component mounting device according to the embodiment of the present invention.
Figure 6B:
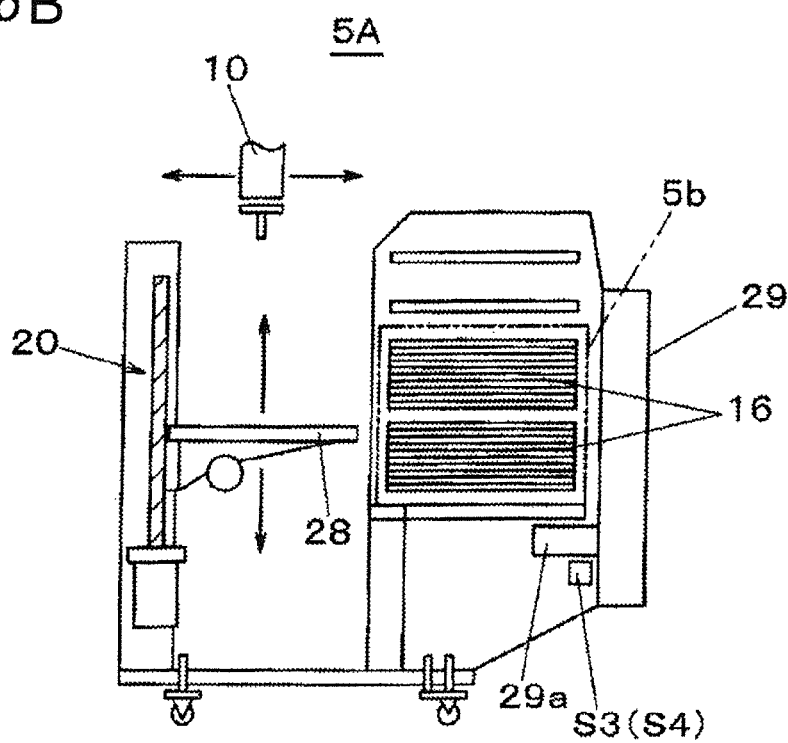

As illustrated in FIG. 6A, the opening of the door 29 is enabled by locating the tray retrieving unit 28 at the component pickup position 5a close to the upper end of the tray housing portion 5b. That is, it is assumed that the tray retrieving unit 28 is at the component pickup position 5a, and blocks the interior of the tray feeder 5 from the head transfer space in which the first mounting head 9A transfers. With this configuration, even if the operator inserts his hand into the interior of the tray housing portion 5b, there occurs no situation in which the hand enters the head transfer space which causes a risk that the hand interferes with the first mounting head 9A.

In this situation, since the first tray supply mechanism 5A, moves up and down inside of the tray feeder 5 in order that the tray retrieving unit 28 retrieves the pallet 16 from the tray housing portion 5b, the access permission/non-permission processor 30b locks the door lock mechanism 29a to always prohibit the open of the door 29. Accordingly, the operator cannot operationally access to the interior of the tray housing portion 5b, and an unsafe action that the operator allows his hand to enter the head transfer space in which the first mounting head 9A is operating is completely precluded.

That is, in the component mounting method according to this embodiment, the tray feeder 5 having the plurality of tray supply mechanisms executes the tray exchange operation that is conducted on the tray housing portion 5b in a state where the lock state of the door 29 is released, and the door 29 is opened in any one tray supply mechanism, and the tray supply operation in which the pallet 16 is retrieved from the tray housing portion 5b by the tray retrieving unit 28, and transferred up to the component pickup position 5a for pickup of the component by the first mounting head 9A in the other tray supply mechanism, simultaneously in parallel.

As a result, in the component mounting including the component supply by the tray feeder, the process change for producing the subsequent substrate type can start without waiting for completion of the component mounting operation currently being executed. Accordingly, even if there is a need to iteratively implement the process change associated with the component type change for the plural types of substrates with a high frequency, a device stop time associated with the component type change can be precluded as much as possible to improve the productivity, and the safety when the process change is conducted during the device operation can be ensured.

The present invention has been described in detail and with reference to the specific embodiments, but it would be obvious to an ordinary skilled person that various changes and modifications can be conducted on the present invention without departing from the spirit and scope of the present invention.

The present invention is based on Japanese Patent Application No. 2010-156883 filed on Jul. 9, 2010, and content thereof is incorporated herein by reference.

INDUSTRIAL APPLICABILITY

The component mounting device and the component mounting method according to the present invention have such advantages that the safety can be ensured when the process change is conducted during the device operation in the component mounting including the component supply by the tray feeder, and are useful in a field where the component mounting operation is conducted on various types of substrates.

DESCRIPTION OF REFERENCE SKINS

1 Component Mounting Device
2 Substrate Transport Mechanism
3 Substrate
4A First Component Supply Unit
4B Second Component Supply Unit
5 Tray Feeder
5A First Tray Supply Mechanism
5B Second Tray Supply Mechanism
5a Component Pickup Position
5b Tray Housing Portion
6 Tape Feeder
7 Y-Axial Transfer Table
8A First X-Axial Transfer Table
8B Second X-Axial Transfer Table
9A First Mounting Head
9B Second Mounting Head
10 Unit Mounting Head
16 Pallet
20 Elevating Mechanism
28 Tray Retrieving Unit
29 Door
29a Door Lock Mechanism

The invention claimed is:

1. A component mounting device for mounting on a substrate electronic components picked up from a component supply unit, comprising:
a tray feeder having a function of:
retrieving a tray by a tray retrieving unit from a tray housing portion which is arranged in the component supply unit and which stores the tray in which the electronic components are arranged in a plane, and
transferring the tray up to a component pickup position set in the vicinity of a height of the upper end of the tray housing portion;
a component mounting mechanism comprising:
a mounting head that picks up and holds the electronic components from the tray transferred to the component pickup position; and
a head transfer mechanism that transfers the mounting head;
a door lock mechanism that locks open/close operations of an operation access door disposed in the tray housing portion in the tray feeder; and
a controller that controls the component supply unit, the component mounting mechanism, and the door lock mechanism,
wherein the controller releases a lock state of the door by the door lock mechanism only in a state where the tray retrieving unit is located at the component pickup position and blocks an interior of the tray feeder from a head transfer space to which the mounting head is transferred.

2. A component mounting method for mounting on a substrate electronic components picked up from a component supply unit, by a component mounting device, the component mounting device comprising:
a tray feeder comprising a plurality of tray supply mechanisms arranged in parallel, each of the tray supply mechanisms having a function of:
retrieving a tray by a tray retrieving unit from a tray housing portion which is arranged in the component supply unit and which stores the tray in which the electronic components are arranged in a plane; and
transferring the tray up to a component pickup position set in the vicinity of a height of the upper end of the tray housing portion;
a component mounting mechanism comprising:
a mounting head that picks up and holds the electronic components from the tray transferred to the component pickup position; and
a head transfer mechanism that transfers the mounting head;
a door lock mechanism that locks open/close operations of an operation access door disposed in the tray housing portion in each of the plurality of tray supply mechanisms: and
a controller that controls the component supply unit, the component mounting mechanism, and the door lock mechanism, and has a function of:
releasing a lock state of the door by the door lock mechanism only in a state where the tray retrieving unit is located at the component pickup position and blocks an interior of the tray feeder from a head transfer space to which the mounting head is transferred,
said component mounting method comprising:
simultaneously executing tray exchange operation conducted on the tray housing portion in a state where the lock state of the door is released and the door is opened in any one of the tray supply mechanisms, and tray supply operation in which the tray is retrieved from the tray housing portion by the tray retrieving unit and transferred up to the component pickup position for pickup of the component by the mounting head in another tray supply mechanism.

* * * * *